United States Patent
Hyot et al.

(10) Patent No.: US 9,793,431 B2
(45) Date of Patent: Oct. 17, 2017

(54) OPTOELECTRONIC DEVICE WITH IMPROVED LIGHT EXTRACTION EFFICIENCY

(71) Applicants: COMMISSARIAT A L'ENERGIE ATOMIQUE ET AUX ENERGIES ALTERNATIVES, Paris (FR); ALEDIA, Grenoble (FR)

(72) Inventors: Bérangère Hyot, Eybens (FR); Florian Dupont, Grenoble (FR)

(73) Assignees: COMMISSARIAT A L'ENERGIE ATOMIQUE ET AUX ENERGIES ALTERNATIVES, Paris (FR); ALEDIA, Grenoble (FR)

( * ) Notice: Subject to any disclaimer, the term of this patent is extended or adjusted under 35 U.S.C. 154(b) by 0 days.

(21) Appl. No.: 15/305,745

(22) PCT Filed: Apr. 20, 2015

(86) PCT No.: PCT/EP2015/058483
§ 371 (c)(1),
(2) Date: Oct. 21, 2016

(87) PCT Pub. No.: WO2015/162080
PCT Pub. Date: Oct. 29, 2015

(65) Prior Publication Data
US 2017/0047477 A1    Feb. 16, 2017

(30) Foreign Application Priority Data

Apr. 22, 2014    (FR) ..................... 14 53608

(51) Int. Cl.
| H01L 33/24 | (2010.01) |
| H01L 33/00 | (2010.01) |
| H01L 33/12 | (2010.01) |
| H01L 33/18 | (2010.01) |

(Continued)

(52) U.S. Cl.
CPC ........ *H01L 33/0066* (2013.01); *H01L 33/005* (2013.01); *H01L 33/0075* (2013.01);
(Continued)

(58) Field of Classification Search
None
See application file for complete search history.

(56) References Cited

U.S. PATENT DOCUMENTS 8,455,284 B2 *  6/2013  Seong ..................... H01L 33/32
                                                              257/13
9,559,256 B2 *  1/2017  Amstatt ............ H01L 21/02603
(Continued)

FOREIGN PATENT DOCUMENTS

| FR | 2 984 599 A1 | 6/2013 |
| WO | 2011/162715 A1 | 12/2011 |

OTHER PUBLICATIONS

International Search Report and Written Opinion dated Jan. 7, 2015 issued in corresponding application No. PCT/EP2015/058483; w/ English partial translation and partial machine translation (16 pages).

*Primary Examiner* — Benjamin Sandvik
(74) *Attorney, Agent, or Firm* — Westerman, Hattori, Daniels & Adrian, LLP (57) ABSTRACT

The optoelectronic device (1) comprises a substrate (2), a light-emitting member (3) comprising an elongate element (4) extending in a direction forming an angle with the substrate (2). An intermediate element (5) is interposed between the substrate (2) and a longitudinal end of the elongate element (4) closest to the substrate (2). Furthermore, the substrate (2) is transparent to said light and the intermediate element (5), transparent to said light, comprises at least one nitride of a transition metal, and has a thickness less than or equal to 9 nm.

21 Claims, 7 Drawing Sheets

(51) Int. Cl.
    *H01L 33/10*     (2010.01)
    *H01L 33/32*     (2010.01)
    *H01L 27/15*     (2006.01)
    *H01L 33/08*     (2010.01)
    *H01L 33/46*     (2010.01)

(52) U.S. Cl.
    CPC .............. *H01L 33/10* (2013.01); *H01L 33/12* (2013.01); *H01L 33/18* (2013.01); *H01L 33/32* (2013.01); *H01L 27/15* (2013.01); *H01L 33/007* (2013.01); *H01L 33/08* (2013.01); *H01L 33/24* (2013.01); *H01L 33/46* (2013.01)

(56) References Cited

U.S. PATENT DOCUMENTS

| | | | | |
|---|---|---|---|---|
| 9,595,637 | B2* | 3/2017 | Kum | H01L 33/08 |
| 2010/0096614 | A1* | 4/2010 | Kim | H01L 21/02538 |
| | | | | 257/13 |
| 2010/0180950 | A1* | 7/2010 | Gao | B82Y 10/00 |
| | | | | 136/265 |
| 2013/0112945 | A1* | 5/2013 | Gilet | H01L 33/06 |
| | | | | 257/13 |
| 2013/0221322 | A1* | 8/2013 | Ohlsson | B82Y 10/00 |
| | | | | 257/13 |
| 2014/0117308 | A1* | 5/2014 | Hyot | H01L 21/02381 |
| | | | | 257/13 |
| 2014/0120637 | A1* | 5/2014 | Hyot | H01L 33/007 |
| | | | | 438/16 |
| 2014/0327037 | A1 | 11/2014 | Dussaigne et al. | |
| 2015/0279672 | A1* | 10/2015 | Hyot | H01L 33/007 |
| | | | | 438/14 |

* cited by examiner

OPTOELECTRONIC DEVICE WITH IMPROVED LIGHT EXTRACTION EFFICIENCY

TECHNICAL FIELD OF THE INVENTION

The invention relates to the field of optoelectronics.

More particularly, the subject of the invention is an optoelectronic device comprising a substrate, a light-emitting member, notably semiconductive, comprising an elongate element extending in a direction forming an angle with the substrate, notably of microwire or nanowire type, an intermediate element interposed between the substrate and a longitudinal end of the elongate element closest to the substrate.

STATE OF THE ART

An optoelectronic device is suitable for converting an electrical signal into light, or electromagnetic radiation, notably with a view to emitting it.

In the context of the production of a light-emitting member of the optoelectronic device, it is known practice to use nanowires or microwires comprising a semiconductive material comprising at least one element from group III and one element from group V of the periodic table of elements. This nanowire is used so as to contribute to the formation of a P-N junction intended to emit the light.

When the light to be emitted is generated, an observer sees the emitted light which escapes from the optoelectronic device. However, a part of the emitted light is absorbed by portions of the optoelectronic device such as, for example, the substrate supporting the light-emitting member or even the elongate elements themselves.

The result thereof is that the efficiency of the optoelectronic device is not optimized.

In this respect, there is an issue with respect to the increasing of the light actually restored by the optoelectronic device, and therefore perceived by the observer.

OBJECT OF THE INVENTION

The aim of the present invention is to propose a solution that makes it possible to improve the light extraction efficiency of the optoelectronic device.

This aim is targeted notably by the fact that the substrate is transparent to said light, and that the intermediate element, transparent to said light, comprises at least one nitride of a transition metal, and has a thickness less than or equal to 9 nm.

Preferably, the substrate is electrically insulating and/or the intermediate element is configured so as to contribute to the injection of charge carriers into the elongate element with a view to emitting said light.

Advantageously, the transition metal is chosen from: titanium, vanadium, chromium, zirconium, niobium, molybdenum, hafnium, tantalum, or a combination thereof.

Preferentially, the substrate is of oxide glass, notably of $SiO_2$-based silicate glass.

According to one embodiment, the device comprises a zone for restoration of said light and a mirror arranged so as to orient at least a part of said light from the light-emitting member toward said restoration zone.

According to one implementation, the device comprises a plurality of light-emitting members each comprising an elongate element, and the intermediate element forms a common layer associated with each of the elongate elements, or each of the elongate elements is associated with a corresponding intermediate element, taking the form of a block, which is specific thereto.

The invention also relates to a method for fabricating an optoelectronic device as described, the fabrication method comprising the following steps:
 provision of the substrate transparent to said light,
 formation of the intermediate element such that it is transparent to said light and that it has a growth surface for the elongate element,
 formation of the light-emitting member comprising a step of growth of the elongate element from the growth surface.

Preferably, said intermediate element being formed by a nitride of a transition metal, the step of formation of the intermediate element comprises a step of deposition of said intermediate element from a gaseous mixture comprising nitrogen and the transition metal.

Advantageously, the step of formation of the intermediate element comprises:
 a step of deposition, notably on the substrate or on a layer of a conductive transparent oxide formed on the substrate, of a layer of the transition metal, notably chosen from Ti, V, Cr, Zr, Nb, Mo, Hf, Ta,
 a step of nitriding of at least a part of the layer of transition metal.

According to a first embodiment, the nitriding step comprises:
 a first nitriding substep performed at least partly at a first temperature by enforcing an injection of a nitriding gas according to a first flow rate,
 a second nitriding substep performed at least partly at a second temperature less than or equal to the first temperature by enforcing an injection of the nitriding gas according to a second flow rate distinct or not from the first flow rate.

Preferably, according to this first embodiment, the nitriding gas injected is ammonia, and:
 the first temperature lies between 1000° C. and 1050° C., notably equal to 1050° C.,
 the first flow rate lies between 500*V/8 sccm and 2500*V/8 sccm, notably equal to 1600*V/8 sccm,
 the second temperature lies between 950° C. and 1050° C., notably equal to 1000° C.,
 the second flow rate lies between 500*V/8 sccm and 2500*V/8 sccm, notably equal to 500*V/8 sccm
where V is the total capacity in liters of a corresponding nitriding chamber.

According to a second embodiment, the nitriding step comprises:
 a first nitriding substep performed at least partly at a first temperature by enforcing an injection of a nitriding gas according to a first flow rate,
 a second nitriding substep performed at least partly at a second temperature greater than or equal to the first temperature by enforcing an injection of the nitriding gas according to a second flow rate distinct or not from the first flow rate.

According to this second embodiment, the nitriding gas injected is ammonia, and:
 the first temperature lies between 400° C. and 1400° C.,
 the first flow rate lies between 10*V/18 sccm and 4000*V/18 sccm, notably equal to 1200*V/18 sccm,
 the second temperature lies between 400° C. and 1400° C.,
 the second flow rate lies between 10*V/18 sccm and 4000*V/18 sccm, notably equal to 1200*V/18 sccm where V is the total capacity in liters of a corresponding nitriding chamber.

Preferentially, the nitriding step is performed in a nitriding chamber placed at a pressure of between 50 mbar and 800 mbar, notably 100 mbar.

Advantageously, the step of growth of the elongate element is performed after the second nitriding substep, or is initiated during the second nitriding substep.

Preferably, the step of growth of the elongate element comprises a step of injection of Ga so as to form it from gallium nitride, said elongate element extending from the corresponding growth surface.

BRIEF DESCRIPTION OF THE DRAWINGS

Other advantages and features will emerge more clearly from the following description of embodiments of the invention given as nonlimiting examples and represented in the attached drawings, in which.

DESCRIPTION OF PREFERRED EMBODIMENTS OF THE INVENTION

For the purposes of the present description, certain terms are first of all defined.

In the present description, the concept of "substantially" means exactly or to within 10%.

"Light" should be understood in the present description to mean an electromagnetic wave, or radiation. This light is associated with a predetermined wavelength. The spectral range of the emission of the light will be able to cover a wide range of wavelengths ranging from the ultraviolet to the infrared. In particular, the predetermined wavelength lies between 300 nm and 1000 nm.

"Elongate element" should be understood to mean a three-dimensional element whose elongation is such that it defines a longitudinal dimension between two opposite longitudinal ends, and one or more lateral dimensions defined according to a section associated with a cutting plane substantially at right angles to the direction of elongation of said elongate element.

According to a particular embodiment, the elongate element is a "nanowire" or "microwire".

Hereinafter in the description, each occurrence of the term "wire" can be replaced without distinction by the term "elongate element".

The term "microwire" or "nanowire" describes a three-dimensional structure of elongate form extending in a preferred direction of which at least one dimension, called lateral dimension, lies between 5 nm and 10 µm, preferably between 50 nm and 2.5 µm. A longitudinal dimension is, for its part, at least equal to or greater than 1 times, preferably at least 5 times and even more preferentially at least 10 times, the greatest of the lateral dimensions. In some embodiments, the lateral dimensions can be less than or equal to approximately 10 µm, preferably lying between 100 nm and 5 µm, more preferentially between 100 nm and 500 nm and even more preferentially between 100 nm and 300 nm. In some embodiments, the height (that is to say the longitudinal dimension) of each microwire or nanowire can be greater than or equal to 500 nm, preferably lying between 1 µm and 50 µm.

"Transparency to the light" should be understood to mean that, when all or part of the light passes through or is displaced in a particular element (a substrate, or the wire in the example below), at least 50% and preferentially at least 70% is not absorbed by said particular element and can be restored. In optics, the transmittance of a material is the fraction of the light flux passing through it. It is also called transmission factor but also transparency.

Figure 1:
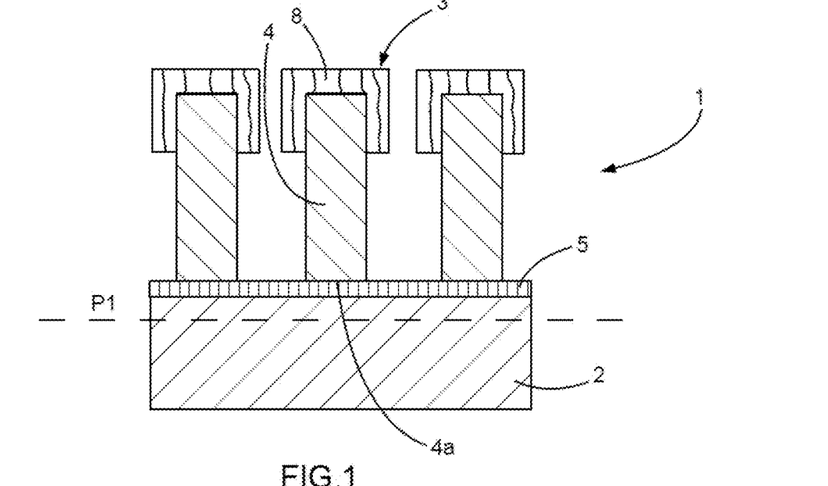
FIGS. 1 and 2 illustrate, by a cross-sectional view, two different embodiments of the invention.
Figure 2:
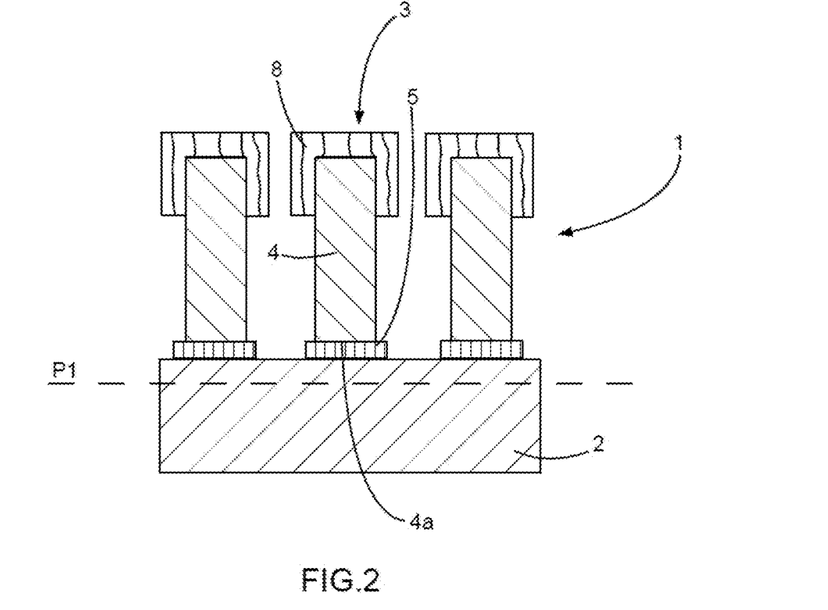

As illustrated in FIGS. 1 and 2, an optoelectronic device 1 comprises a substrate 2 and a light-emitting member 3 comprising a wire 4 extending in a direction forming an angle with the substrate 2.

"Extending in a direction forming an angle with the substrate 2" should be understood to mean that this angle is non-zero. In other words, the elongation of the wire 4 is such that the latter extends between first and second opposite longitudinal ends, said first longitudinal end being closer to the substrate 2 than the second longitudinal end.

In particular, the wire 4 is substantially vertical in the reference frame linked to the substrate 2. The expression "reference frame linked to the substrate 2" should be understood to mean that the plane of the substrate P1 is a so-called "horizontal" plane whatever the position of the optoelectronic device in the terrestrial reference frame. In other words, the wire 4 is substantially at right angles to the plane P1 of the substrate 2.

The device further comprises an intermediate element 5 interposed between the substrate 2 and a longitudinal end 4a of the wire 4 closest to the substrate 2. The substrate 2 is transparent to said light. The intermediate element 5, transparent to said light, comprises at least one nitride of a transition metal, and has a thickness less than or equal to 9 nm, and preferably less than or equal to 7 nm. This thickness more particularly lies between 3 nm and 5 nm inclusive.

In a general manner applicable to all the embodiments described, the intermediate element 5 can have a thickness greater than or equal to 3 nm.

The thickness of the intermediate element 5 is given according to a direction substantially at right angles to the plane of the substrate 2. Typically, the substrate 2 comprises a working face on which the intermediate element 5 is preferentially directly in contact, or with the interposition of a material having a particular function. The thickness is, in this case, according to the direction of the vector normal to the working face.

The thickness of the intermediate element 5, as described above, gives it a transparency to said light.

Preferably, the intermediate element 5 is in direct contact with the wire 4. The result thereof is that a part of the light propagated in the wire 4 during the operation of the optoelectronic device can pass through the intermediate element 5 at its interface with said wire 4.

To be transparent, the substrate 2 is preferentially produced in doped GaN, in doped ZnO if it is sought for the latter to also have electrically conductive properties or, in the case of an electrically insulating substrate 2, it can be of oxide glass, synthetic quartz, $Al_2O_3$, AlN, BN, diamond (the last five of these materials are crystalline solids).

Oxide glass should be understood to mean glass based on $SiO_2$ (silicate glasses) or glass based on $B_2O_3$ (borate glass), or glass based on $P_2O_5$ (phosphate glass) or glass combining these different oxide bases. These materials are non-crystalline solids.

Consequently, the transparency given to the substrate 2 and to the intermediate element 5 makes it possible to avoid having these "components" absorb the light, thus increasing the quantity of light that can be restored by the optoelectronic device to an observer.

Furthermore, the intermediate element 5 is also preferentially electrically conductive. In this sense, the intermediate element 5 is configured so as to contribute to the injection of charge carriers (electron or holes) into the wire 4 with a view to emitting said light.

It is understood from what has been stated above that the substrate 2 can be electrically insulating or conduct and, in the latter case, it can contribute, via the intermediate element 5, to the injection of charge carriers into the wire 4.

The invention is of course not limited to a single light-emitting member 3. Everything stated in the present description concerning a light-emitting member 3 can be applied to a plurality of light-emitting members 3. In this sense, as illustrated by FIGS. 1 and 2, the optoelectronic device 1 can comprise a plurality of light-emitting members 3, each comprising a wire 4. In the context of the embodiment of FIG. 1, the intermediate element 5 forms a common layer associated with each of the wires 4. In other words, the wires 4 of all the light-emitting members 3 extend from a same intermediate element 5 taking the form of a layer covering all or part of a face of the substrate 2 (in the example of FIG. 1, all the wires 4 are directly in contact—notably physical and electrical—with a same intermediate element).

Alternatively, each of the wires 4 is associated with a corresponding intermediate element 5, taking the form of a block, which is specific to it (FIG. 2). In other words, the optoelectronic device comprises a plurality of intermediate elements 5, and each intermediate element 5 forms a block from which extends a single wire 4 of a corresponding light-emitting member 3. The embodiment of FIG. 2 usually requires more technological steps, but the result is that the use of less transition metal (nitrided) limits the general absorption of the light emitted notably between two light-emitting members 3.

In addition to the features of the intermediate element 5 described above, the transition metal nitride also advantageously makes it possible to facilitate the growth of the wire 4 in the fabrication of the optoelectronic device. The result thereof is that the presence of the intermediate element 5 allows both for a substantially vertical growth relative to the substrate 2 and a growth with a high density. This point will be detailed hereinbelow.

Preferentially, the transition metal is chosen from: titanium, vanadium, chromium, zirconium, niobium, molybdenum, hafnium, tantalum, or a combination thereof. The nitride of the latter allows, in the thickness concerned of the intermediate element 5, a high transparency and a low intrinsic electrical resistivity allowing an injection of current (charge carriers) through the base of the wire 4 formed by the longitudinal end 4a of the wire 4 closest to the substrate 2.

The niobium nitride is particularly advantageous in as much as it exhibits a resistivity of 58 $\mu\Omega\cdot cm$. It is therefore an excellent electrical conductor.

The light-emitting member 3 is preferentially a light-emitting diode (LED) comprising a P-N junction. In this context, the wire 4 can constitute the junction (it then comprises a first n-doped section and a second p-doped section placed in the continuity of the first section). More specifically, the bottom part of the wire (proximal to the intermediate layer) is n-doped then a shell of p-doped material is next deposited on the top part of the wire (distal to the intermediate layer). Thus, charge carriers of a first type can be injected by the intermediate element 5 into the wire 4 via the longitudinal end 4a of said wire 4 closest to the substrate 2, and charge carriers of a second type can be injected into the emitting member in a zone situated at a distance from the substrate 2. The recombining of these charge carriers of the first type and of the second type then generates photons forming said emitted light. According to the mode of execution visible in FIGS. 1 to 4 and 6, the wire 4 is formed in a semiconductor material with a first type of doping and the optoelectronic device comprises an additional semiconductor element 8 (preferentially forming the shell described above) with a second type of doping opposite the first type so as to form the P-N junction (it will then be understood that the first and second types of doping are chosen between a p doping and an n doping). Preferentially, the additional element 8 forms a shell, or sheath, around the wire 4. To improve the efficiency of the light-emitting member 3, quantum wells are preferentially interposed between the wire 4 and the additional element 8 (not represented in the figures).

The P-N junction can be a homojunction or a heterojunction.

In other words, it will be understood that, generally, the light-emitting member 3 comprises a first part with a first type of doping (P or N) and a second part with a second type of doping (N or P) opposite the first type, said wire 4 forming all or part of the first part of the light-emitting member 3. The association of the first and second parts of the light-emitting member 3 forming the P-N junction.

By virtue of the use of an intermediate element 5 and of a substrate 2 as described, it has been described above that the absorption of photons by the optoelectronic device itself was limited. Since this absorption is limited, it remains to maximize the restoration of the light outside of the optoelectronic device, notably toward the observer. In this sense, the optoelectronic device preferentially comprises one or more mirrors. In other words, the optoelectronic device comprises a light restoration zone 7 and a mirror 6 arranged so as to orient at least a part (F1) of the light from the light-emitting member or members 3 toward the restoration zone 7 (FIGS. 3 to 6). In fact, it will be understood here that the light-emitting member 3 generates said light and emits it multidirectionally. In this sense, there will be an aim to recover photons of said light whose displacement is oriented in a direction away from the restoration zone 7, and direct them deliberately toward said restoration zone 7.

Figure 3:
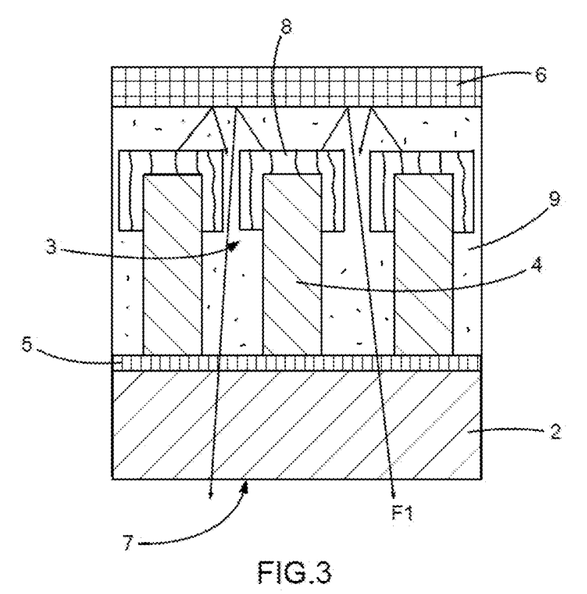
FIGS. 3 to 6 illustrate, by a cross-sectional view, refinements implementing a mirror for increasing the light restored.
Figure 4:
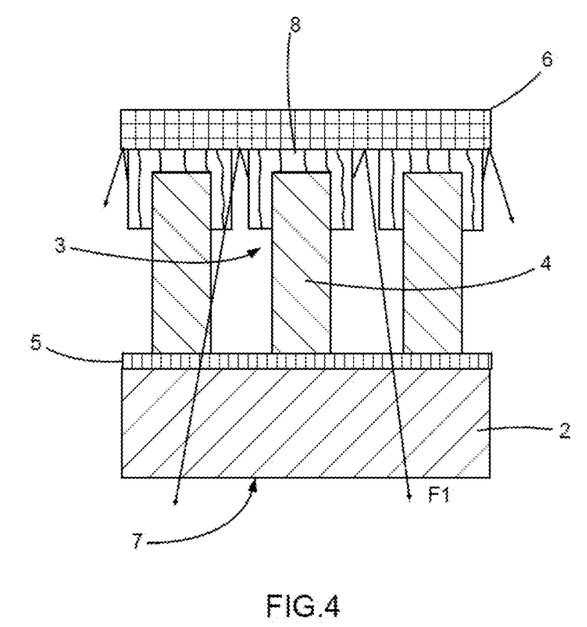
Figure 5:
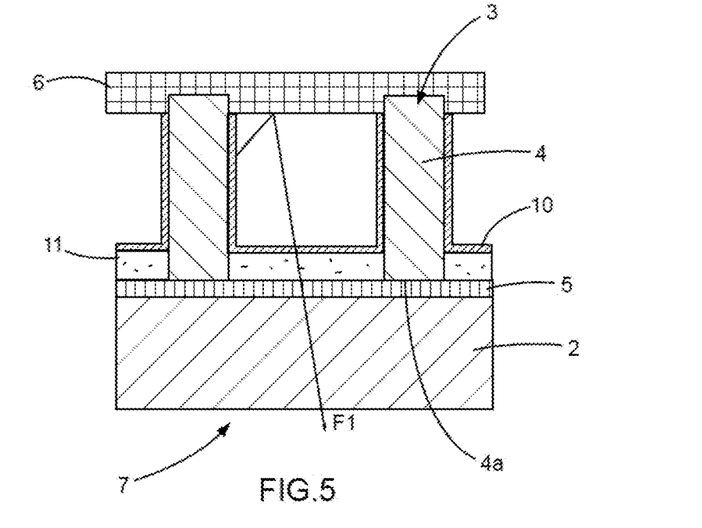

According to a first embodiment using a mirror illustrated in FIGS. 3 to 5, the light-emitting member 3 is interposed, notably wholly or partly, between the mirror 6 and the substrate 2. The arrows starting from the light-emitting members 3 schematically represent the path of a photon of the emitted light. It will be understood here that the restoration zone 7 is proximal to the substrate 2 and that the light is extracted/restored by the transparent substrate 2. More particularly, the restoration zone 7 is disposed on or consists of the face of the substrate 2 opposite that facing, or in contact with, the intermediate element 5.

According to a first variant of the first embodiment using a mirror illustrated in FIG. 3, the mirror 6 is held at a distance from the light-emitting members 3, notably by the interposition of a transparent insulating material 9, for example SiO$_2$ or SiN. The mirror 6 can be formed of silver or of aluminum, or alternatively be a Bragg mirror comprising an alternation of electrically insulating layers such as SiN or SiO$_2$ to ensure a sufficient reflectivity in the field of the wavelength of the light emitted by the emitting member or members. In this first variant, although not represented, an injection of charge carriers is advantageously performed opposite the longitudinal end of said wire 4 closest to the substrate 2 or on the lateral flank of the wires, this injection can be implemented by a layer of a conductive transparent material, for example of TCO type.

According to a second variant of the first embodiment using a mirror, the mirror 6 can be metallic (for example of silver), and in this case it can advantageously be in electrical contact with the light-emitting member 3 (FIG. 4) so as to allow the injection of charge carriers intended to contribute to the generation of the light emitted. The use of the mirror 6 to inject charge carriers makes it possible to improve the internal quantum efficiency of the optoelectronic device compared to the use of the conductive transparent material TCO of the first variant of the first embodiment using a mirror.

According to a third variant of the first embodiment using a mirror illustrated in FIG. 5, the mirror 6 is in contact with the emitting member 3 emitting light at a distance from the substrate 2 and the lateral flanks of a portion of the doped light-emitting member 3 (here the wire 4) of the second type and arranged between the mirror 6 and the substrate 2 are covered by a charge carrier injection layer 10 of conductive transparent material (preferably TOO). In this case, the intermediate element 5 allows the injection of charge carriers into a portion of the doped emitting member 3 of the first type opposite to the second type and including the longitudinal end 4a of the wire 4 closest to the substrate 2. Here, as in the second variant, the mirror 6 can also contribute to the injection of charge carriers. This architecture has the advantage of combining a good electrical contact on the doped material (notably p-doped) with a surface through which the photons can escape. In FIG. 5, a mask 11 having been used for the growth of the wire 4 is advantageously used to avoid the short circuit between the layer 10 and the intermediate element 5. This mask 11 is therefore preferentially electrically insulating.

In the context of the first two variants of the first embodiment (FIGS. 3 and 4), the reference 11 also represents a mask having been used for the growth of the wire 4.

Figure 6:
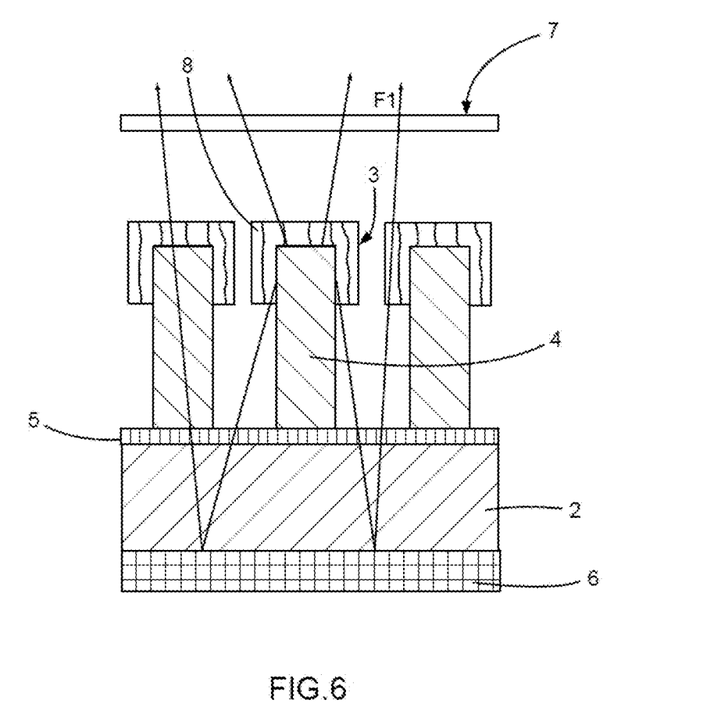

According to a second implementation using a mirror illustrated in FIG. 6, the mirror 6 is arranged facing a face of the substrate 2 opposite the face of said substrate 2 facing, or in contact with, the intermediate element 5. In this case, the emitting member 3, when operating, emits light in such a way that at least one part is emitted toward the restoration zone 7 (arrow F1) and another part toward the substrate 2. Said other part then passes in succession through the intermediate element 5, the substrate 2, then comes to be reflected on the mirror 6 so as to go back toward the restoration zone 7. The routing of the light is schematically represented by arrows starting from the emitting member 3. Here again, the mirror 6 can be of aluminum or be formed by a Bragg mirror as described previously.

The wire 4 can comprise, or consist of, a semiconductive material comprising at least one element from group III and one element from group V (preferably a nitride of an element of group III) of the periodic table of elements.

Advantageously, the wire or wires 4 are of gallium nitride. Gallium nitride is a good candidate for forming an optoelectronic device.

Figure 7:
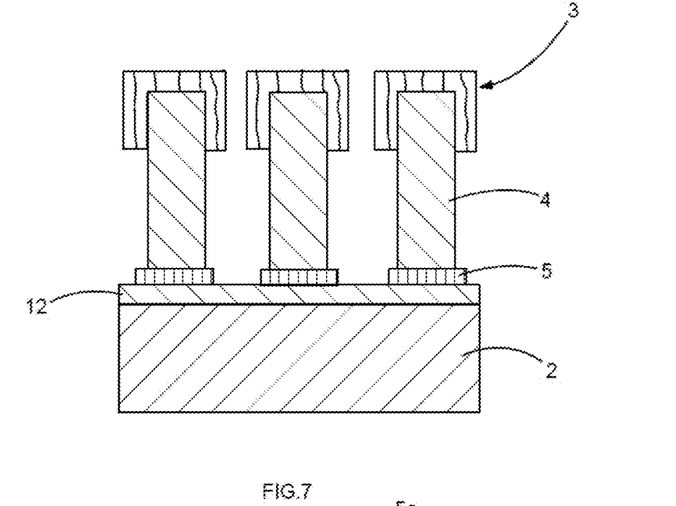
FIG. 7 illustrates a variant in which a layer of a transparent conductive oxide is inserted between the intermediate element and the substrate.

According to a refinement illustrated in FIG. 7 and applicable to all the embodiments described above (but all the more valid when the substrate is electrically insulating), it is sought to improve the electrical conductivity of the intermediate element 5 (preferentially of each intermediate element). In this sense, the optoelectronic device can comprise an electrical conduction layer 12 of a transparent and electrically conductive material, for example TCO (transparent conductive oxide). This conduction layer 12 is interposed between the substrate 2 and the intermediate element 5. When the optoelectronic device comprises a plurality of emitting members 3 each associated with a distinct intermediate element 5, this conduction layer 12 also offers the advantage of pooling the injection of charge carriers into all the wires 4 of the light-emitting members 3 via the corresponding intermediate elements 5.

The electrical conduction layer 12 can have a thickness (according to the normal to the face of the substrate on which it is formed) that varies from 1 nm to 1000 nm, and is preferentially equal to 50 nm. In this precise case of 50 nm, the electrical connection of the longitudinal end or ends of the wires 4 closest to the substrate 2 will be assured with a 5% optical absorption of the lower structure, referred to here as the optical absorption introduced by the electrical conduction layer preferentially of TCO.

The invention also relates to a method for fabricating the device as described previously.

Figure 8:
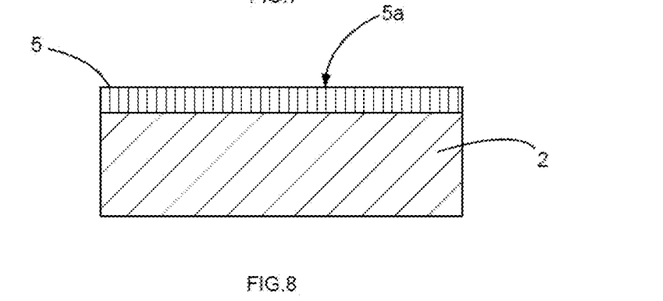
FIGS. 8 and 9 illustrate two steps of a method for fabricating the optoelectronic device.
Figure 9:
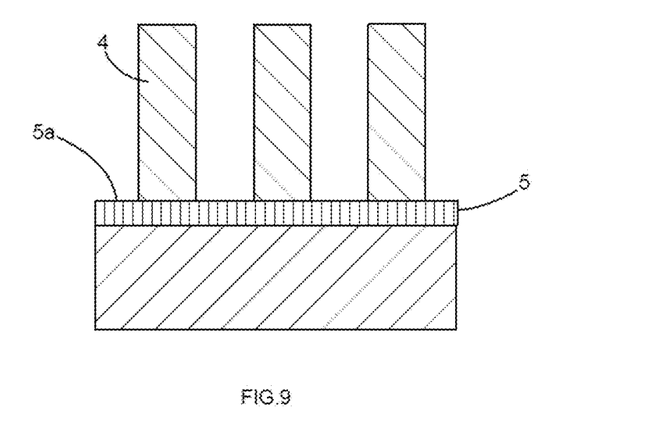

The method for fabricating the optoelectronic device comprises the following steps:
supply of the substrate 2 transparent to said light (FIG. 8),
formation of the intermediate element 5 of a thickness less than or equal to 9 nm, preferably less than or equal to 7 nm and notably between 3 nm and 5 nm inclusive, such that it is transparent to said light and such that it has a growth surface 5a for the wire 4,
formation of the light-emitting member 3 comprising a step of growth of the wire 4 (FIG. 9) from the growth surface 5a.

It will then be understood that the intermediate element 5 therefore serves as germination/nucleation element allowing the growth of the wire 4. In addition to the properties of the intermediate element 5 in the context of the finished optoelectronic device, it is found that in the context of a transparent substrate, notably of oxide glass (notably of silicate glass based on SiO$_2$), this thickness less than 9 nm, formed directly on said substrate 2, makes it possible to obtain a wire 4 of satisfactory verticality. In the context of the present invention it turns out that the more the thickness of the intermediate element 5 deposited on the substrate 2 is increased, the more the wires 4 are formed anarchically and in a way unsuited to a functionalization of the wire 4 in order to form the light-emitting member 3. Furthermore, the intermediate element 5 as described exhibits a crystallographic structure that lends itself to the growth of said wire.

This phenomenon is most particularly heightened when the fabrication method uses the following parameters: the substrate 2 is of oxide glass (notably of silicate glass based on SiO$_2$), the intermediate element 5 is formed by a nitride of niobium or of hafnium or of zirconium directly formed/deposited on the substrate 2. Furthermore, the transition metal formed by the niobium is preferred because it has been noted that the latter allowed for a better discharging of the charges during the operation of the optoelectronic device.

The possibility of the intermediate element 5 forming a layer common to a plurality of wires 4, notably extending from this layer, or a block associated with a single wire 4, has been described above.

The intermediate element 5 can be produced from any type of deposition technique. Furthermore, by virtue of the transition metal used, it has the advantage of exhibiting a smaller gap than the nucleation layers based on AlN very widely used to date as nucleation layer.

According to a first embodiment, the intermediate element 5 is deposited in vapor phase from a gaseous mixture comprising nitrogen and a transition metal chosen from titanium, vanadium, chromium, zirconium, niobium, molybdenum, hafnium, tantalum, or a combination thereof.

Notably, the deposition of the intermediate element 5 is performed at a temperature between ambient temperature and 400° C. The surface intended for the growth of the wire 4 is thus obtained directly, after this deposition. In other words, when the intermediate element 5 is formed by a nitride of a transition metal, the step of formation of the intermediate element 5 preferentially comprises a step of deposition of said intermediate element 5 from a gaseous mixture comprising nitrogen and the transition metal.

According to a second embodiment, the intermediate element 5 is formed from the following steps: the deposition, notably on the substrate 2 or on a layer of conductive transparent oxide formed on the substrate 2, of a layer of a transition metal chosen from titanium, vanadium, chromium, zirconium, niobium, molybdenum, hafnium, or tantalum; and the nitriding of at least a part of the layer of transition metal deposited so as to form the intermediate element 5 in nitride of transition metal having a surface 5a intended for the growth of the wire 4. Preferably, the deposition of the layer of transition metal is performed at a temperature between ambient temperature and 400° C. The deposition of the layer of transition metal can be performed by PVD (physical vapor phase deposition) from a metal target, for example a sputtering with direct current passing through the target (for example the current I passing through the target can be 400 mA on a target of niobium of 99.95 purity for 45 s to deposit approximately 9 nm of Nb, 18 s to deposit 5 nm of Nb and 9 s to deposit 3 nm of Nb). During this step of deposition of the transition metal, the substrate 2 can be kept at ambient temperature.

In a way generally applicable to all the description, "ambient temperature" should be understood to mean a temperature preferably between 20° C. and 50° C.

The pressure in the PVD chamber during the deposition of the transition metal can be between $3 \cdot 10^{-3}$ mbar and $6 \cdot 10^{-3}$ mbar.

After various tests, it has been possible to observe that the growth of the wire or wires was favored by this intermediate element 5 formed in two steps so it will therefore be understood that this second embodiment is preferred.

Figure 10:
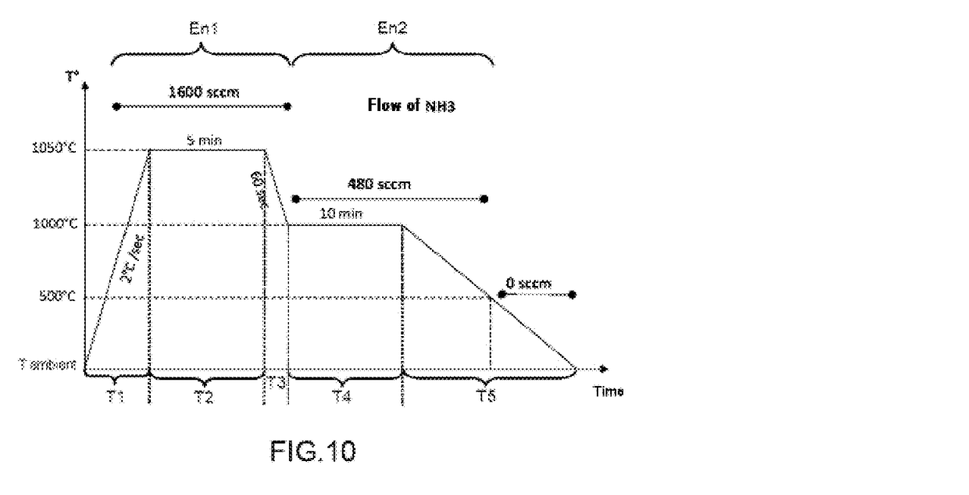
FIGS. 10 to 12 illustrate embodiments of a nitriding step of the fabrication method.

According to a first particular implementation of the second embodiment, notably illustrated in FIG. 10, the nitriding step can comprise a first nitriding substep En1 performed at least partly at a first temperature by enforcing an injection of a nitriding gas at a first flow rate, and a second nitriding substep En2 performed at least partly at a second temperature less than or equal to the first temperature by enforcing an injection of the nitriding gas at a second flow rate distinct (or not, that is to say that the first flow rate can be equal to the second flow rate) from the first flow rate. This makes it possible to optimize the crystallographic orientation of the intermediate element 5. It goes without saying that these two nitriding substeps are performed one after the other with or without the inclusion of a phase in which the injection of gas is stopped. In particular, the first substep En1 makes it possible to perform a fast nitriding and the second substep En2 makes it possible to perform a bake stabilizing the nitride phase of the transition metal. Following these two substeps En1 and En2, the layer of nitride transition metal is chemically and thermally stable.

The gas injected can be ammonia ($NH_3$) and/or dinitrogen ($N_2$). $NH_3$ is preferred because it makes it possible to nitride the layer of transition metal more rapidly. In fact, in the $NH_3$ form, the nitriding power is greater than for $N_2$.

According to a particular example of the first particular implementation of the second embodiment, the nitriding gas injected being ammonia, the first temperature is between 1000° C. and 1050° C., notably equal to 1050° C., the first flow rate is between 500 sccm and 2500 sccm (sccm is a flow rate unit "standard cubic centimeters per minute"), notably equal to 1600 sccm, the second temperature is between 950° C. and 1050° C., notably equal to 1000° C., the second flow rate is between 500 sccm and 2500 sccm, notably equal to 500 sccm.

The flow rates mentioned above correspond to the volume capacity of the nitriding chamber used, i.e. a total volume of gas (for example $N_2+NH_3$) of 8 liters in the example mentioned. For a chamber of different volume, the flow rates will have to be adapted (for example: for an 18-liter chamber, the first flow rate will have to be notably equal to 4000 sccm and the second flow rate notably equal to 1200 sccm). In other words, the first flow rate is between 500*V/8 sccm and 2500*V/8 sccm, notably equal to 1600*V/8 sccm, and the second flow rate is between 500*V/8 sccm and 2500*V/8 sccm, notably equal to 500*V/8 sccm. V is the total capacity in liters of a corresponding nitriding chamber.

In the present description, "corresponding nitriding chamber" should be understood to mean the chamber in which the nitriding of the layer of transition metal is performed.

FIG. 10 illustrates in detail the nitriding step by representing the trend of the temperature as a function of time in the nitriding chamber (with a volume of 8 liters in the example). In a first stage T1, the temperature in the nitriding chamber rises gradually, for example at 2° C./s, to reach a level of 1050° C. The first nitriding substep in $NH_3$ En1 targeted above begins when the temperature reaches 200° C. During this first substep the flow rate of $NH_3$ remains constant at 1600 sccm. In a second stage T2, concomitant with at least a part of the first substep, the temperature is kept at 1050° C. for a time between 5 minutes and 15 minutes (5 minutes in the example). In a third stage T3, the first substep En1 is continued while the temperature passes from 1050° C. to 1000° C. in 60 s. In a fourth stage T4, the temperature in the nitriding chamber is kept at 1000° C. for a time between 5 minutes and 15 minutes (10 minutes in the example), and the second substep En2 is begun. In a fifth stage T5, the input of calories into the nitriding chamber is stopped so that the temperature in the nitriding chamber drops back to revert to ambient temperature. The duration of T5 can correspond to the inertia of the nitriding chamber. The second nitriding substep can be continued for a determined time during the fifth stage T5. The fifth stage T5 can correspond to a stopping of the heating of the chamber followed by its lowering of temperature or can equally correspond to a step of growth of the wire or wires if the chamber used for the nitriding is also the MOCVD (metal organic chemical vapor phase deposition) chamber dedicated to the synthesis of the wire or wires.

Figure 11:
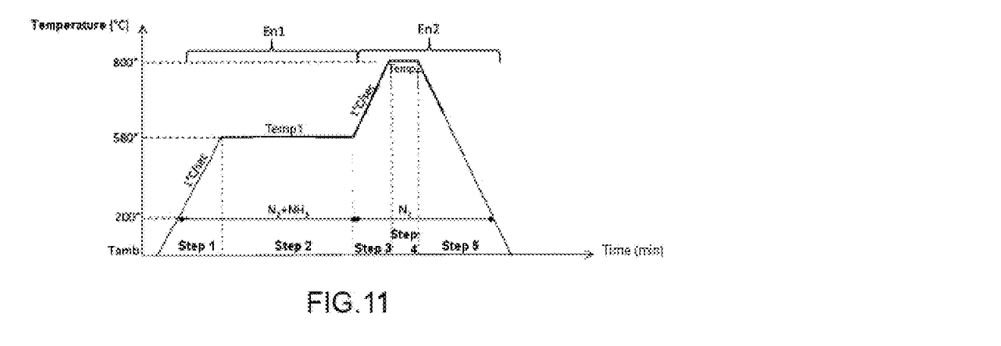
Figure 12:
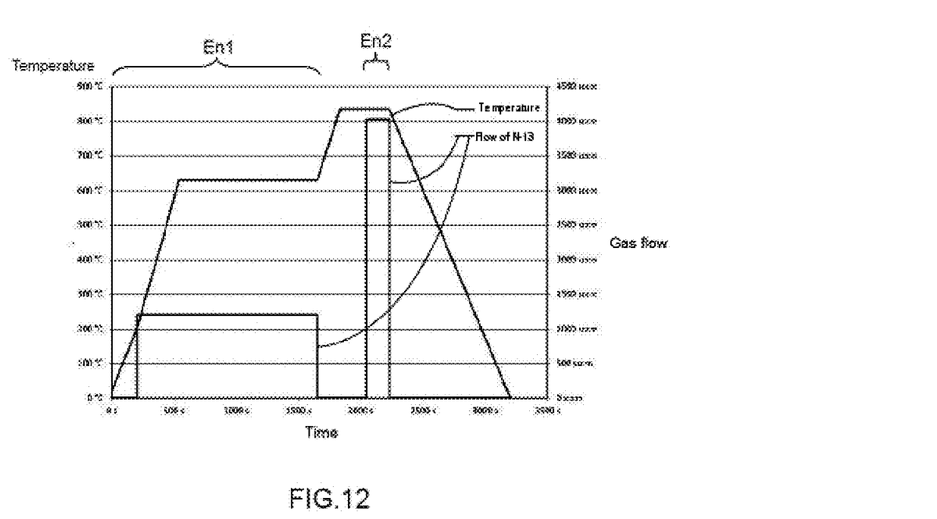

According to a second particular implementation illustrated in FIGS. 11 and 12, the nitriding step comprises a first nitriding substep En1 performed at least partly at a first temperature by enforcing an injection of a nitriding gas at a first flow rate, a second nitriding substep En2 performed at least partly at a second temperature greater than or equal to the first temperature by enforcing an injection of the nitriding gas at a second flow rate distinct, or not (that is to say that the first flow rate can be equal to the second flow rate), from the first flow rate.

In particular, in this second implementation of the embodiment, the gas injected is ammonia and the first temperature is between 400° C. and 1400° C., the first flow rate is between 10*V/18 sccm and 4000*V/18 sccm, notably equal to 1200*V/18 sccm, the second temperature is between 400° C. and 1400° C., the second flow rate is between 10*V/18 sccm and 4000*V/18 sccm, notably equal to 1200*V/18 sccm, where V is the total capacity in liters of a corresponding nitriding chamber.

In FIG. 11, the temperature Temp1 is between 400° C. and 1050° C. (or 1400° C.), notably between 500° C. and 800° C., and preferentially equal to 600° C.

The first substep En1 is subdivided for clarity into two steps: step 1 and step 2.

In step 1 of FIG. 11, a rise in temperature to Temp1 (that is to say the first temperature) is observed. The carrier gases are $N_2$, $N_2+H_2$, or $H_2$, preferentially $N_2$. The nitriding gas injected can be ammonia ($NH_3$) and the injection can begin for a temperature between Tamb (representative of ambient temperature) and Temp1; notably from 200° C. The temperature rise ramp from Tamb to Temp1 is greater than 1° C./min, and notably equal to 1° C./sec. During this step 1, the flow rate of ammonia can be between 10×V/18 sccm and 4000×V/18 sccm, notably equal to 1200×V/18 sccm (where V is the volume of the chamber in liters). Generally, the ratio of the flows of ammonia to nitrogen ($NH_3/N_2$) can be between 0.0005% and 100%, preferably between 0.0055% and 22%, notably equal to 6.6%.

In step 2 of FIG. 11, a bake is performed at Temp1. The carrier gases are $N_2$, $N_2+H_2$, or $H_2$, preferentially $N_2$. The nitriding gas injected can be ammonia ($NH_3$). The flow rate of ammonia can be between 10×V/18 sccm and 4000×V/18 sccm, notably equal to 1200×V/18 sccm (where V is the volume of the chamber in liters). Generally, the ratio of the flows of ammonia to nitrogen ($NH_3/N_2$) can be between 0.0005% and 100%, preferably between 0.0055% and 22%, notably equal to 6.6%. Preferably, the bake time in $NH_3$ is greater than 1 second, notably between 5 minutes and 30 minutes.

The second substep En2 is subdivided for clarity into three steps: step 3, step 4 and step 5. Preferably, the second temperature Temp2 is between 400° C. and 1050° C. (or 1400° C.), notably between 500° C. and 1000° C., preferentially equal to 800° C. In the step 3 (if Temp1≠Temp2, otherwise there is a direct transition to the step 4), the temperature has risen to Temp2. The carrier gases are $N_2$, $N_2+H_2$, or $H_2$, preferentially $N_2$. The nitriding gas injected can be ammonia ($NH_3$). The temperature rise ramp from Temp1 to Temp2 is greater than 1° C./min and notably equal to 1° C./sec. The flow rate of ammonia can be between 10×V/18 sccm and 4000×V/18 sccm, notably equal to 1200×V/18 sccm (where V is the volume of the chamber in liters). Generally, the ratio of the flows of ammonia to nitrogen ($NH_3/N_2$) can be between 0.0005% and 100%, preferably between 0.0055% and 22%, notably equal to 6.6%.

In the step 4, a bake is performed at Temp2. The carrier gases are $N_2$, $N_2+H_2$, or $H_2$, preferentially $N_2$. The nitriding gas injected can be ammonia ($NH_3$). The flow rate of ammonia can be between 10×V/18 sccm and 4000×V/18 sccm, notably equal to 1200×V/18 sccm (where V is the volume of the chamber in liters). Generally, the ratio of the flows of ammonia to nitrogen ($NH_3/N_2$) can be between 0.0005% and 100%, preferably between 0.0055% and 22%, notably equal to 6.6%. The bake time in $NH_3$ is greater than 1 second, notably between 1 and 30 minutes.

In the step 5, the temperature is lowered back. The carrier gases are $N_2$, $N_2+H_2$, or $H_2$, preferentially $N_2$. The nitriding gas injected can be ammonia ($NH_3$). The temperature lowering ramp from Temp2 to Tamb is greater than 1° C./min and notably equal to 1° C./sec. The flow rate of ammonia can be between 10×V/18 sccm and 4000×V/18 sccm, notably equal to 1200×V/18 sccm (where V is the volume of the chamber in liters). Generally, the ratio of the flows of ammonia to nitrogen ($NH_3/N_2$) can be between 0.0005% and 100%, preferably between 0.0055% and 22%, notably equal to 6.6%.

According to a very particular example illustrated in FIG. 12, the nitriding of the transition metal, preferentially of the niobium, deposited on the substrate, notably of oxide glass (notably of silicate glass based on $SiO_2$), is ideal when the following successive steps are performed in an appropriate nitriding chamber (here with a volume of 18 liters in the example) in which is placed the substrate on which is formed a layer of the transition metal (as a solid plate or in the form of islands/blocks):

- a first rise in temperature to 200° C. under a flow of nitrogen $N_2$ of 20000 sccm under a nitriding chamber pressure of 100 mbar,
- a second rise in temperature to 630° C. performed in continuity with the first rise in temperature at 1.25° C./s in a flow of gaseous mixture of nitrogen and ammonia with a flow rate of 1400 sccm of $NH_3$ and a flow rate of 18600 sccm of $N_2$ under a nitriding chamber pressure of 100 mbar,
- maintaining the temperature of 630° C. for 900 s in a flow of gaseous mixture of nitrogen and ammonia with a flow rate of 1400 sccm of $NH_3$ and a flow rate of 18600 sccm of $N_2$ under a nitriding chamber pressure of 100 mbar,
- a third rise in temperature to 830° C. in a gaseous flow with a flow rate of 20000 sccm of $N_2$ at a nitriding chamber pressure of 100 mbar,
- maintaining the temperature of 830° C. for 210 s in a gaseous flow with a flow rate of 20000 sccm of $N_2$ at a nitriding pressure of 100 mbar,
- maintaining the temperature of 830° C. for 185 s in a flow of gaseous mixture of nitrogen and ammonia with a flow rate of 4000 sccm of $NH_3$ and a flow rate of 16000 sccm of $N_2$ under a nitriding chamber pressure of 400 mbar.

Finally, preferentially, a step of lowering of the temperature is performed in a gaseous flow of 20000 sccm of $N_2$ under a nitriding chamber pressure of 400 mbar.

Advantageously, the growth of the wire is performed before the temperature lowering step. The wire can then be of GaN formed by MOCVD.

Figure 13:
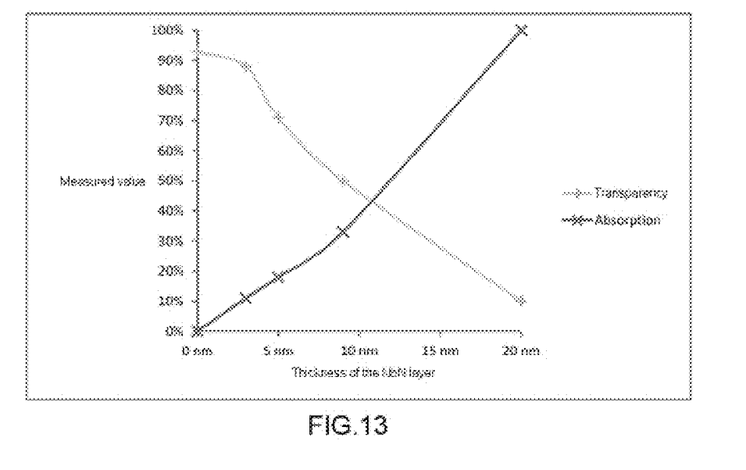
FIG. 13 illustrates curves of transparency and of absorption as a function of the thickness of a layer of niobium nitride.

According to the process of FIG. 12, a very satisfactory result is obtained, notably for niobium as transition metal. FIG. 13 illustrates, for an intermediate element 5 produced in niobium nitride according to the implementation of the particular example of FIG. 12, measurements of transmission and of absorption as a function of the thickness of the intermediate element 5. It can therefore be seen that below 9 nm, a transmission greater than 50% for a light of wavelength at 450 nm is briskly obtained. In particular, this FIG. 13 makes it possible to highlight the fact that, for a thickness of 3 nm of the intermediate element 5, the transparency is 88% and that, for a thickness of 5 nm of the intermediate element, the transparency is 71%.

The steps associated with FIG. 10 are preferably implemented when the transition metal is Ta (in this case, the first temperature is preferentially greater than the second temperature in the nitriding step). In effect, for this material, a notable improvement is obtained in the quality of the wires obtained (verticality, uniformity of form) compared to the implementation of FIG. 11. Conversely, and for the same reasons, the implementation of FIG. 11 applies more particularly when seeking to nitride transition metal of type: Zr, Hf, Nb (in this case, the first temperature is preferentially less than the second temperature in the nitriding step).

In the different embodiments above, the nitriding step is advantageously performed in a nitriding chamber set at a pressure of between 50 mbar and 800 mbar, notably 100 mbar.

Furthermore, the step of growth of the wire or wires can be performed after the second nitriding substep En2, or is initiated during the second nitriding substep En2.

Figure 14:
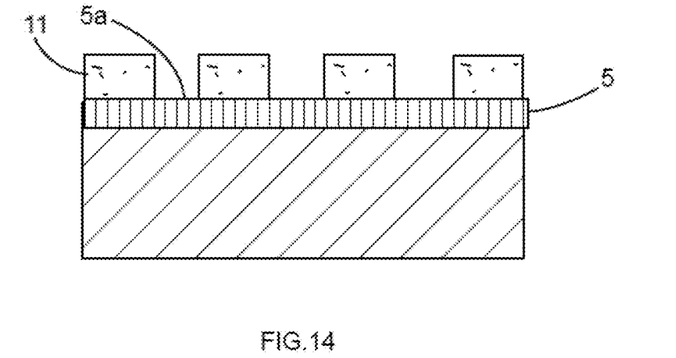
FIGS. 14 to 16 illustrate the use of a mask for the growth of one or more elongate elements.

According to a refinement, it is sought to locate a zone of growth of the wire 4 at a given point. In this sense, as illustrated in FIG. 14, the step of formation of the light-emitting member comprises a step of formation of a mask 11 delimiting at least one particular surface 5a of the intermediate element 5 intended for the growth of the wire.

Where the aim is to simultaneously grow a plurality of wires, it is possible to use an intermediate element 5 taking the form of a continuous layer common to all the wires by forming, on said common continuous layer, the mask 11, such that it has a plurality of openings each delimiting a growth surface 5a, corresponding to a portion of the surface of said common continuous layer, for a corresponding wire (FIG. 14).

Figure 15:
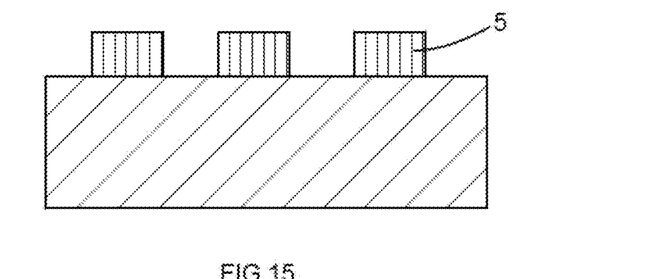
Figure 16:
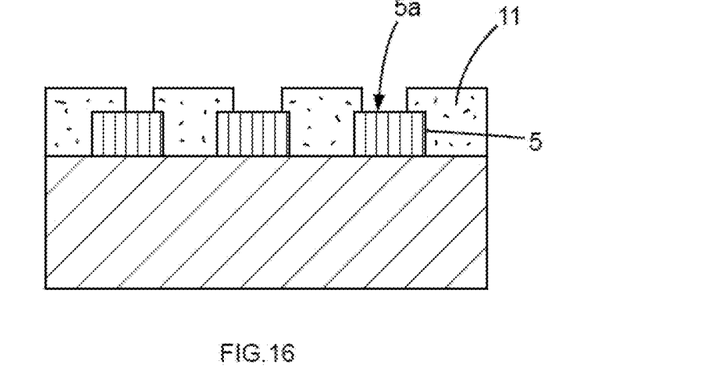

Alternatively, in the embodiment where each wire is associated with an intermediate element 5 in block form, the method can comprise a step of formation of a plurality of blocks each forming an intermediate element 5 (FIG. 15), for example by etching an initial layer so as to delimit each block. Then, the mask 11 can be formed so as to delimit, at each block 5, a growth surface 5a for a corresponding wire (FIG. 16).

The mask can be formed by SiN or $SiO_2$.

The step of growth of the wire 4 advantageously comprises a step of injection of Ga so as to form it in gallium nitride, said wire 4 extending from the corresponding growth surface 5a.

The result of everything stated above is that the use of the intermediate element 5 as described makes it possible equally to:
have a crystalline structure compatible with that of the semiconductive material forming the wire so as to promote a suitable growth thereof,
ensure a transparency to the emitted light that makes it possible to increase the quantity of photons restored,
ensure an electrical conductivity suited to the injection of charge carriers into the wire.

In a way generally applicable to everything stated above, the substrate will preferentially be such that it includes a thermal stability allowing the epitaxy of nanowires or microwires, which proceeds in the region of 1000° C.

The invention claimed is:

1. An optoelectronic device comprising:
a substrate,
a light-emitting member comprising an elongate element extending in a direction forming an angle with the substrate, and
an intermediate element interposed between the substrate and a longitudinal end of the elongate element closest to the substrate,
wherein:
the substrate is transparent to said light, and
the intermediate element, transparent to said light, comprises at least one nitride of a transition metal, and has a thickness less than or equal to 9 nm.

2. The device as claimed in claim 1, wherein at least one of (i) the substrate is electrically insulating and (ii) the intermediate element is configured so as to contribute to the injection of charge carriers into the elongate element with a view to emitting said light.

3. The device as claimed in claim 2, wherein the substrate is of oxide glass.

4. The device as claimed in claim 3, wherein the substrate is of $SiO_2$-based silicate glass.

5. The device as claimed in claim 1, wherein the substrate is of oxide glass.

6. The device as claimed in claim 2, wherein the transition metal is chosen from the group consisting of titanium, vanadium, chromium, zirconium, niobium, molybdenum, hafnium, tantalum, and combinations thereof.

7. The device as claimed in claim 1, wherein the transition metal is chosen from the group consisting of titanium, vanadium, chromium, zirconium, niobium, molybdenum, hafnium, tantalum, and combinations thereof.

8. The device as claimed in claim 5, wherein the substrate is of $SiO_2$-based silicate glass.

9. The device as claimed in claim 1, comprising a zone for restoration of said light and a mirror arranged so as to orient at least a part of said light from the light-emitting member toward said restoration zone.

10. The device as claimed in claim 1, comprising a plurality of light-emitting members each comprising an elongate element, and wherein the intermediate element forms a common layer associated with each of the elongate elements.

11. The device as claimed in claim 1, comprising a plurality of light-emitting members each comprising an elongate element, and wherein each of the elongate elements is associated with a corresponding intermediate element, taking the form of a block, which is specific thereto.

12. A method for fabricating an optoelectronic device as claimed in claim 1, comprising:
providing the substrate transparent to said light,
forming the intermediate element so that the intermediate element is transparent to said light and so that the intermediate element has a growth surface for the elongate element, and
forming the light-emitting member comprising growing the elongate element from the growth surface.

13. The method as claimed in claim 12, wherein, the intermediate element is formed by a nitride of a transition metal, and the formation of the intermediate element comprises depositing the intermediate element from a gaseous mixture comprising nitrogen and the transition metal.

14. The method as claimed in claim 12, wherein the formation of the intermediate element comprises:
depositing a layer of the transition metal,
nitriding at least a part of the layer of transition metal.

15. The method as claimed in claim 14, wherein the nitriding comprises:
- a first nitriding performed at least partly at a first temperature by enforcing an injection of a nitriding gas according to a first flow rate, and
- a second nitriding performed at least partly at a second temperature less than or equal to the first temperature by enforcing an injection of the nitriding gas according to a second flow rate distinct or not from the first flow rate.

16. The method as claimed in claim 15, wherein the nitriding gas injected is ammonia, and wherein:
- the first temperature lies between 1000° C. and 1050° C.,
- the first flow rate lies between 500*V/8 sccm and 2500*V/8 sccm,
- the second temperature lies between 950° C. and 1050° C.,
- the second flow rate lies between 500*V/8 sccm and 2500*V/8 sccm where V is a total capacity in liters of a corresponding nitriding chamber.

17. The method as claimed in claim 14, wherein the nitriding comprises:
- a first nitriding performed at least partly at a first temperature by enforcing an injection of a nitriding gas according to a first flow rate, and
- a second nitriding performed at least partly at a second temperature greater than or equal to the first temperature by enforcing an injection of the nitriding gas according to a second flow rate distinct or not from the first flow rate.

18. The method as claimed in claim 17, wherein the nitriding gas injected is ammonia, and wherein:
- the first temperature lies between 400° C. and 1400° C.,
- the first flow rate lies between 10*V/18 sccm and 4000*V/18 sccm,
- the second temperature lies between 400° C. and 1400° C.,
- the second flow rate lies between 10*V/18 sccm and 4000*V/18 sccm, where V is a total capacity in liters of a corresponding nitriding chamber.

19. The method as claimed in claim 14, wherein the nitriding is performed in a nitriding chamber placed at a pressure of between 50 mbar and 800 mbar.

20. The method as claimed in claim 14, wherein the growth of the elongate element is performed after the second nitriding, or is initiated during the second nitriding.

21. The method as claimed in claim 12, wherein the growth of the elongate element comprises injecting Ga so as to form the elongate element from gallium nitride, the elongate element extending from the corresponding growth surface.

* * * * *